United States Patent [19]

Wiemer

[11] 3,907,616

[45] Sept. 23, 1975

[54] METHOD OF FORMING DOPED DIELECTRIC LAYERS UTILIZING REACTIVE PLASMA DEPOSITION

[75] Inventor: Klaus C. Wiemer, Richardson, Tex.

[73] Assignee: Texas Instruments, Incorporated, Dallas, Tex.

[22] Filed: Aug. 16, 1974

[21] Appl. No.: 498,008

Related U.S. Application Data

[63] Continuation of Ser. No. 306,755, Nov. 15, 1972, abandoned.

[52] U.S. Cl. .................. 148/188; 148/187; 427/95; 204/164; 204/192

[51] Int. Cl.[2] .......................................... H01L 7/36

[58] Field of Search ........... 148/186, 187, 188, 174, 148/175, 1.5; 117/201, 106 A, 93.1 CD, 93.1 GD, 93.1 PF; 204/164, 192

[56] References Cited

UNITED STATES PATENTS

| | | | |
|---|---|---|---|
| 3,226,270 | 12/1965 | Miederer et al. | 148/174 |
| 3,287,243 | 11/1966 | Ligenza | 204/192 |
| 3,405,581 | 6/1969 | Shortes | 148/187 |
| 3,418,229 | 12/1968 | Lakshmanan et al. | 204/192 |
| 3,476,619 | 11/1969 | Tolliver | 148/187 |
| 3,492,175 | 1/1970 | Conrad et al. | 148/175 |
| 3,532,564 | 10/1970 | Gittler | 148/188 |
| 3,576,685 | 4/1971 | Swann et al. | 148/187 |
| 3,698,071 | 10/1972 | Hall | 117/201 X |

FOREIGN PATENTS OR APPLICATIONS

| | | | |
|---|---|---|---|
| 1,006,803 | 10/1965 | United Kingdom | 148/187 |

*Primary Examiner*—G. Ozaki
*Attorney, Agent, or Firm*—Harold Levine; James T. Comfort; Richard L. Donaldson

[57] ABSTRACT

A doped oxide layer is formed on a semiconductor substrate utilizing reactive plasma deposition. Impurity doped thin film oxide deposits are formed by reacting suitable source gases in an RF plasma at low pressures and temperatures. Passing an dopant compound in vapor form with a suitable carrier gas, in combination with a flow of silicon hydride and an oxide vapor flow, provides a solid film of doped silicon dioxide on a surface when the gases are subjected to an RF discharge. The method features low temperature processing which is particularly advantageously utilized in providing a doped oxide layer as a diffusion source for a Group III–V substrate.

13 Claims, 10 Drawing Figures

METHOD OF FORMING DOPED DIELECTRIC LAYERS UTILIZING REACTIVE PLASMA DEPOSITION

Figure 1A:
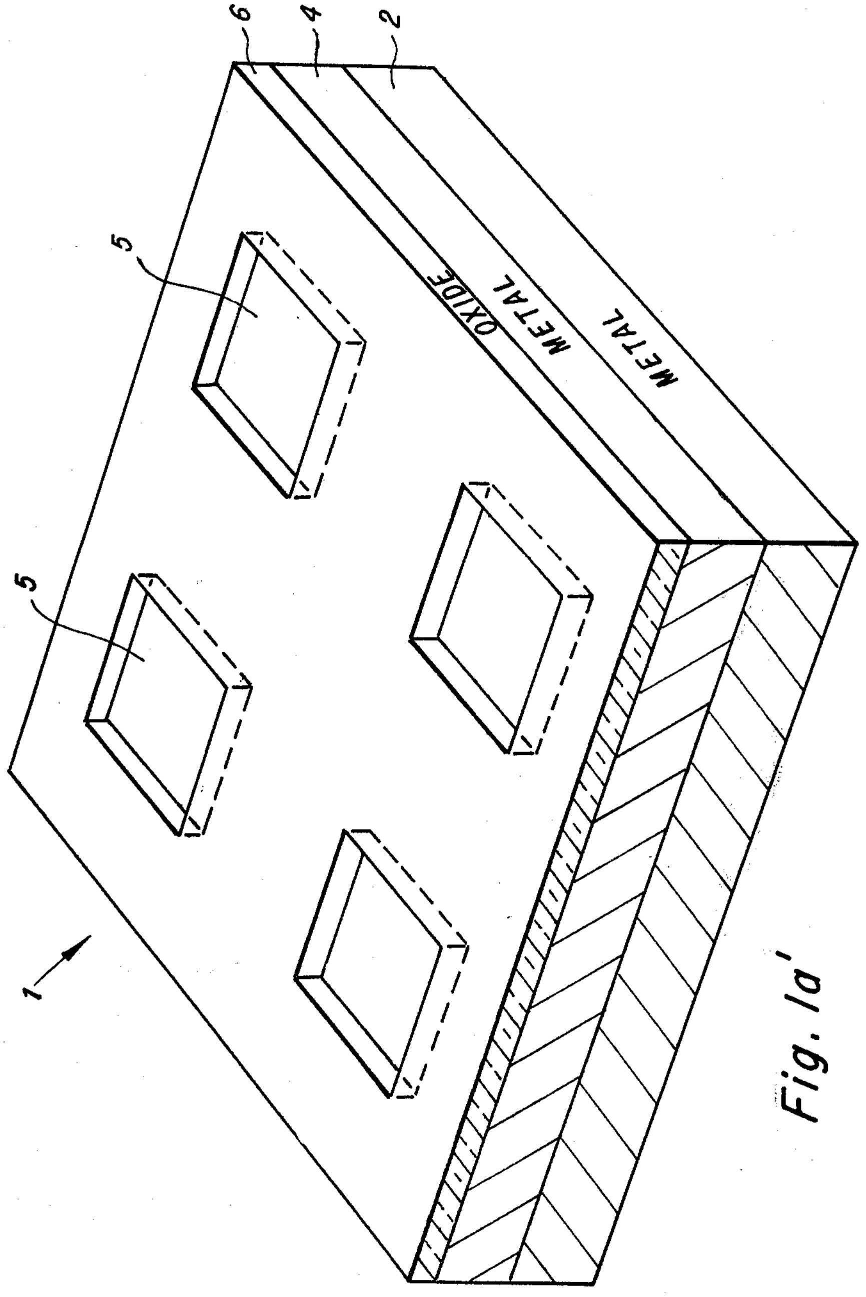
Figure 1A:
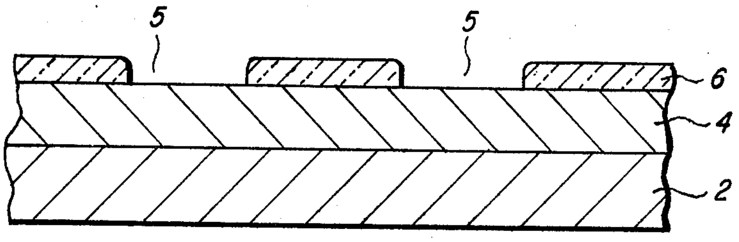

This is a continuation, of application Ser. No. 306,755, filed Nov. 15, 1972, now abandoned.

This invention relates generally to methods for depositing doped oxide coatings on suitable substrates and more particularly to methods for forming doped oxides utilizing RF dicharge for utilization as a diffusion source.

Diffusion of impurities into specific semiconducting materials is a well established process in the solid state electronics art. Conventional diffusion techniques proceed at elevated temperatures, thereby limiting the types of substrates which are suitable for the process to those substrates which withstand high temperature processing without degradation. One such process is set forth in U.S. Pat. No. 3,340,445 issued to Scott et al for Semiconductor Devices Having Modifier-Containing Surface Oxide Layer, issued Sept. 5, 1967. Many substrates, however, are inherently unstable at elevated temperatures and accordingly certain precautions are required during the diffusion step. For example, III-V semiconducting compounds have conventionally required a coating of a thin dielectric layer overlying the substrate to withstand the high temperature required for diffusion which must proceed in a sealed, evacuated environment. Furthermore, the quantity of the dopant material must be precisely and exactly measured. This process has proven awkward and expensive due to the irretrievable cost of the ampoule in which the semiconductor and dopant material is enclosed.

Another method of doping semiconductor substrate material is by ion implantation, a technique now well-known for certain specific semiconductors. Ionized particles of the desired impurity species are accelerated by a high electric field into the semiconductor. The mass of the ionized particle has been found to be a limiting factor, and accordingly relatively heavy elements, such as are utilized in III-V semiconductor technology, are not appropriate dopants. Furthermore, even though using the ion implantation method, semiconductor crystals typically need to be subsequently heat treated or annealed at elevated temperatures to activate the implanted impurity and to heal the radiation damage.

The semiconductor industry has long sought a method utilizing a doped oxide layer as a diffusion source for Group III-V substrates to provide a low temperature process alleviating the special handling requirements conventionally needed. However, attempts at forming doped oxide layers on selected substrates have proven unsuccessful. One method investigated involved the RF sputtering of metal and quartz simultaneously to form the doped oxide layer. This technique has proven to yield unsatisfactory uniformity and repeatability.

Another method suggested for forming a doped oxide layer utilizes a doped silicon polymer employed with the appropriate impurity in an alcohol base. This material is spun onto the semiconductor slice and the alcohol is allowed to evaporate. The residual comprises a doped silicon oxide layer which may be used as a diffusion source. This method, however, also provided inadequate uniformity and repeatability, and generally inadequate doping levels after diffusion, due to a practical limit on the concentration of impurity in the spun-on solution.

Deposition of undoped dielectric layers utilizing RF discharge is well-known, as illustrated by British Pat. No. 1,006,803 to Stirling et al, for Improvements in or Relating to Semiconductor Devices, Oct. 6, 1965. However, the teaching was not concerned with providing impurity doped layers, or techniques therefor. Copending patent application Ser. No. 192,957 (now U.S. Pat. 3,757,733 issued Sept. 11, 1973) by A. R. Reinberg, for Radial Flow Reactor, filed Oct. 27, 1971, provides a method for forming dielectric coatings as passivators on a plurality of substrates simultaneously by RF discharge techniques.

To date, the most frequently utilized method for diffusing into semiconductor substrates which exhibit inherent instability at the high temperatures needed to provide "drive-in," comprises coating the III-V substrate with a thin dielectric layer which is sealed with a precisely measured quantity of the dopant material in an evacuated quartz ampoule. The ampoule is then inserted into a high temperature furnace at temperatures greater than 800°C for a selected time. The furnace temperature is sufficiently high to provide an appreciable vapor pressure of the impurity causing a certain amount thereof to diffuse into the semiconductor. The final dopant concentration depends on the vapor pressure of the impurity in the ampoule and the length of the diffusion time and the temperature. This method requires a high material and labor cost due to the necessity of ampoule utilization.

Accordingly, a primary object of the present invention is to provide a low temperature process for depositing a doped dielectric film upon a selected substrate in a low pressure atmosphere utilizing electrical discharge.

A further object of the present invention is to provide a low temperature method for depositing doped oxide on semiconductor substrates utilizing reactive plasma deposition in a low pressure atmosphere.

It is yet another object of the present invention to provide a low temperature process for depositing a doped oxide film on a Group III–V semiconductor substrate.

It is still another object of the present invention to provide a method of diffusing into a Group III–V semiconductor substrate in an open tube furnace utilizing a doped dielectric layer as a diffusion source.

Briefly, and in accordance with one aspect of the present invention, an organometallic vapor, a silicon hydride, and a gaseous source of oxygen is contacted with a semiconductor substrate in a reaction zone in the presence of an RF discharge to form a doped oxide layer. The oxide coated substrate is then heated to drive impurities from the oxide into the semiconductor.

In a preferred embodiment, a controlled amount of an inert gaseous carrier such as argon is bubbled through a controlled temperature and pressure reservoir of a Group II through Group VI organometallic liquid such as dimethyl zinc. A controlled amount of the organometallic compound is vaporized and contained in the inert carrier gas. This mixture is passed along with a controlled flow of a silicon hydride gas and a controlled flow of oxygen or an oxygen-producing gas through the active zone of a reaction chamber having therein a Group III–V substrate to be coated. An RF discharge is generated within the active zone forming a doped silicon dioxide layer by a low temperature reactive plasma deposition on the substrate. By depositing an undoped oxide layer overlying the substrate and doped layer, drive-in from the diffusion source is accomplished at high temperature without damaging the thermally unstable substrates.

Other novel features, objects and advantages of the present invention will become apparent in view of the following detailed description of the illustrative embodiments of the invention in conjunction with the drawings wherein:

FIGS. 1*a* through 1h depict the semiconductor substrate during the various processing steps in accordance with this invention;

FIG. 1*a'* is a three-dimensional plan view of the substrate shown in FIG. 1*a;*

Figure 2:
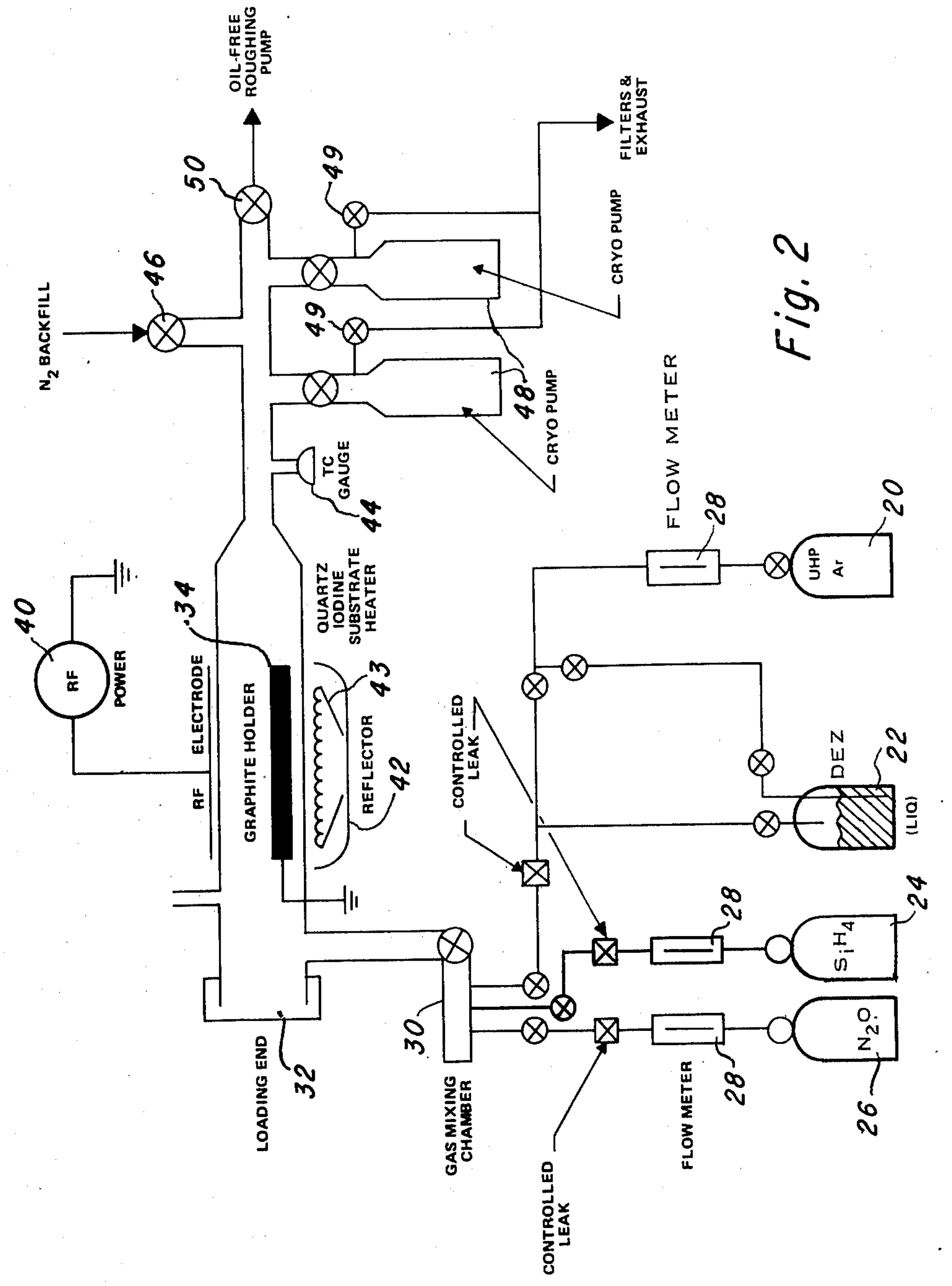

FIG. 2 is a schematic/pictorial of a reactive plasma deposition reactor utilized according to this invention.

The reactive plasma deposition method of this invention is applicable to a variety of applications. For example, although particularly advantageously utilized for forming doped dielectric films on substrates inherently unstable at high temperatures, the process is also suitably applied to substrates relatively stable at high temperatures. Suitable substrates in the semiconductor technology include Group III–V and Group IV elements. A wide variety of dopants is available, suitably chosen from Group II through Group VI elements. It will be appreciated that other materials and reactant gases known to those skilled in the art will be suitably utilized in the method of this invention.

With reference to FIG. 1*a*, a semiconductor device upon which the method of this invention is practiced, is shown generally at 1. For purposes of specifically setting forth a preferred embodiment, an n-type gallium arsenide substrate 2 is shown with an overlying n-type gallium arsenide phosphide epitaxially grown layer 4. Such a gallium arsenide device is useful for a variety of applications, but particularly useful in providing visible light emitting diodes (VLED's). Typically substrate 2 exhibits a resistivity in the range of 0.006 to 0.01 ohm centimeters. The gallium arsenide phosphide layer 4 is epitaxially grown as is well-known in the art to exhibit a resistivity of 0.01 ohm centimeters. A nitride mask 6 is shown selectively provided by techniques well-known in the art to allow the selective diffusion into the epilayer 4 through the openings 5 in the mask layer 6. FIG. 1*a'* is a plan view of the gallium arsenide phosphide device 1 showing a plurality of selectively spaced openings 5 such as to provide an array of diffused regions into the epitaxial layer 4. The device shown in FIG. 1*a'* may be scribed to provide the discrete final gallium arsenide VLED's, or the diodes may be selectively interconnected while still intact providing an array.

Figure 1B:
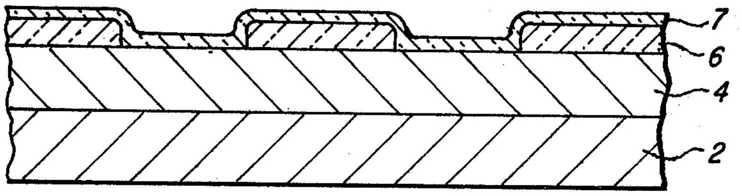

After the silicon nitride mask has been provided to a sufficient thickness, such as 1000 angstroms, a relatively thin oxide layer 7 is formed over the mask 6 into apertures 5. A suitable thickness for the undoped oxide layer 7 is 50–100 angstroms. Such a layer 7 has shown to advantageously enhance combination of a relatively heavy doping element in relatively heavy doping concentrations with the substrate. For example, as will later be seen, a desired concentration of p-type impurity for VLED devices in gallium arsenide phosphide substrates is $10^{16}$ atoms/cm$^3$, a relatively heavy concentration. However, if an indium antimonide substrate is utilized as layers 2 and 4, a zinc doping concentration of only $10^{15}$ atoms/cm$^3$ is required for optimum infrared detection. In such a case layer 7 need not be applied in the process as the concentration is relatively light. Such a device is shown in FIG. 1g.

Figure 1C:
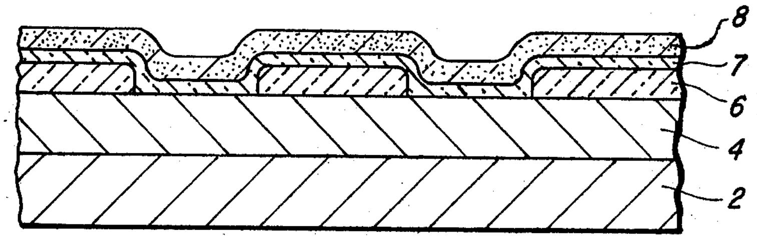

In FIG. 1c a doped oxide layer 8 has been formed overlying the undoped oxide layer 7. The thickness of doped oxide layer 8 is inversely proportional to the doping concentration. That is, in a gallium arsenide VLED doped with zinc to provide the p-region of the pn junction, a doping impurity concentration of the zinc atom is $10^{18}$ atoms/cm$^2$. Accordingly, a required number of impurity atoms must be contained in layer 8 to provide the final concentration of $10^{16}$ atoms/cm$^2$ in the layer 4. A thin, heavily-doped layer 8 may by design choice be utilized or a relatively thicker, less concentrated layer may be chosen. It has been experimentally determined that only approximately 1% of the total impurity ions in the doped layer 8 subsequently diffuses into the substrate. Therefore, a $10^{18}$ atoms/cm$^3$ concentration is desired in the doped layer which is readily provided in a layer 8 2000 angstroms thick. Of course, other thicknesses providing the desired concentration may suitably be chosen.

Figure 1D:
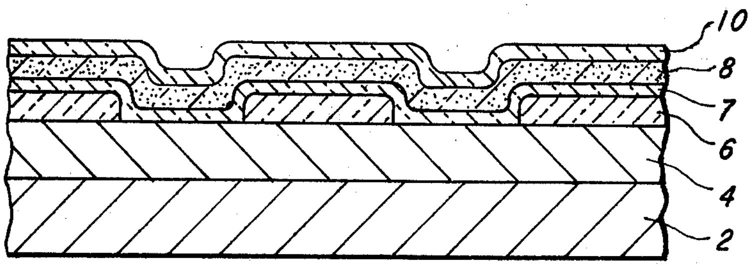

FIG. 1d shows a subsequently formed barrier layer 10 overlying doped oxide layer 8 and preferably comprises undoped oxide. Layer 10 is suitably 1,000–2,000 angstroms thick, and is utilized as a barrier against outdiffusion from the substrate during the subsequent drive-in process step. This feature is explained in more detail with regard to the drive-in diffusion step.

Figure 1E:
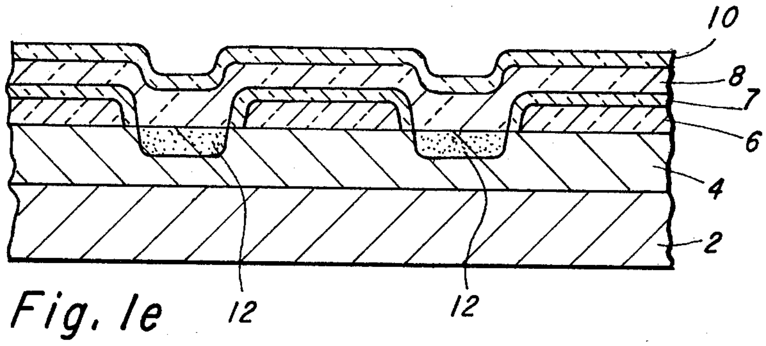
Figure 1F:
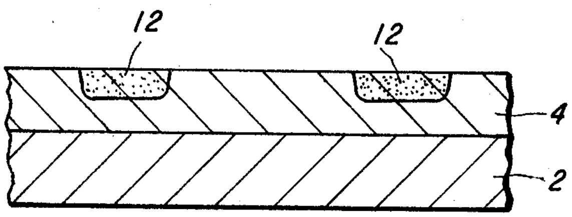
Figure 1G:
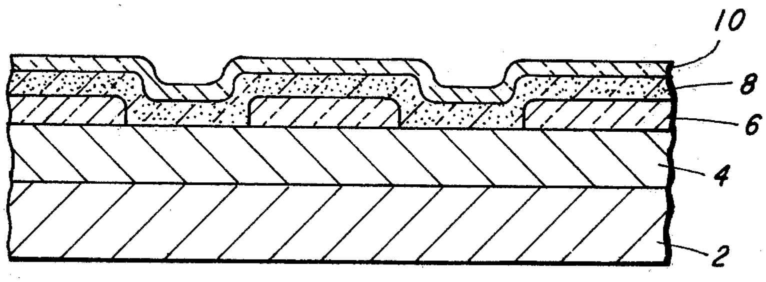
Figure 1H:
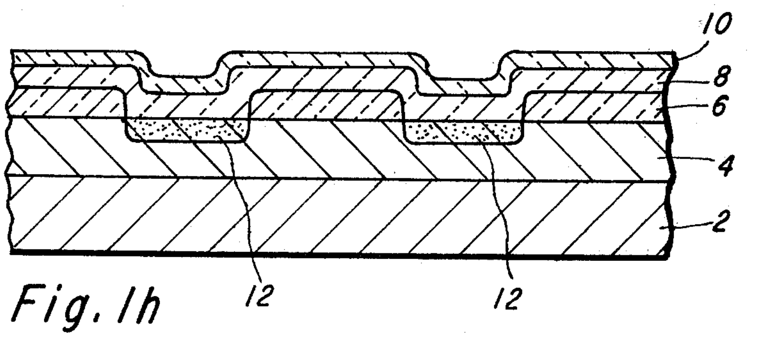

FIG. 1e shows the gallium arsenide phosphide device 1 after the high temperature application required to drive in the impurity atoms from the doping source layer 8. Exposing the slice to a temperature in the range of 800°–850°C for a period of 5 to 10 minutes typically provides the desired doping concentration of the zinc-doped gallium arsenide phosphide VLED. The metallic zinc ions and ions formed by decomposition of zinc oxide during the high temperature migrate into the n-type gallium arsenide phosphide layer 4. The pockets of p-type material provided by the in-diffusion convert the n-type gallium arsenide phosphide into p-type regions, preferably 2–4 microns thick and having a sheet resistivity of preferably 20–40 ohms per square. Such a resistivity range corresponds to a specific resistivity of about 5 to 10 × $10^{-3}$ ohm-cm which is appreciably lower than that resistivity provided by conventional sealed-ampoule diffusion techniques and which provides a higher surface carrier concentration. The higher surface carrier concentration is essential in providing light emitting diodes with a high degree of brightness. Furthermore, the process of this invention provides controlled reproducibility and uniformity in the degree of brightness allowing lighter specifications. The desired depth of the diffused regions to between 2–4 microns thick guarantees a well-defined p-n junction. The particular thickness of diffused regions 12 is directly related to the time of the drive-in cycle, above set forth as preferably five to ten minutes.

Because gallium arsenide is a relatively unstable compound at high temperatures, the undoped oxide layer 10 is utilized during the drive-in step to minimize out-diffusion and prevent decomposition of the semiconductor substrate. That is, the arsenic in gallium arsenide devices and the phosphorus and arsenic in gallium arsenide phosphide devices tend to out-diffuse at high temperature and accordingly provide a device after drive-in with a smaller amount of the Group V constituent. However, the barrier layer 10 prevents out-diffusion to thereby maintain the stoichiometry of the substrate material. In addition, by providing small amounts of arsenic, phosphorus, or both in the barrier 10, the out-diffusion effects may further be minimized. Any undoped oxide or nitride of sufficient thickness suffices as barrier layer 10.

As depicted in FIG. 1*a'*, monolithic light emitter arrays are suitably fabricated utilizing this method as are also discrete VLED's.

The device shown in FIG. 1a utilizes a gallium arsenide phosphide compound, but other Group III–V substrates also are suitably utilized by the abovedescribed process. For example, indium antimonide, likewise relatively unstable at high temperatures, is conventionally doped with a relatively heavy element such as zinc in providing the p-type region of the pn junction. Indium antimonide diodes are utilized as infrared detectors. Other III–V substrates advantageously utilized in the method of the invention include gallium arsenide, gallium phosphide, gallium indium arsenide, gallium aluminum arsenide. Besides zinc, cadmium is another Group II element which has proven to be suitable diffused into n-type III–V substrates by the above-described method. However, the method is not limited to providing p-type dopants in n-type substrates, as selenium, sulfur and tellurium, readily convert p-type substrates into n-type regions by the above-described method.

Having described utilization of doped dielectric layers such as zincdoped oxide, as diffusion sources for forming pn junctions in semiconductor substrates, the specific equipment and techniques will now be discussed. Heretofore, relatively heavy doping elements such as zinc, selenium, cadmium, sulfur and tellurium have proven unsuitable in doped dielectric diffusion techniques due to the inability of providing a reliable and reproducible concentration of such heavy dopants in the dielectric layer. Shown in FIG. 2 is a reactive plasma deposition reactor system which will provide even relatively heavy doping elements in the doped oxide layer. The high temperature diffusion from the doped oxide layer then proceeds in an open-end furnace on even unstable substrates such as III–V compounds. The RF plasma thin film deposition system employs a quartz or PYREX horizontal reaction chamber having a plurality of joining valves and connections. All the vacuum components such as valves and manifolds, are stainless steel and all seals are metal seals throughout the system. Cryogenic pumps 48 and an oil-free roughing pump are coupled through valves for evacuating the chamber. Coupled thereto are additional valves 49 to filters and for exhausting vapors after the RF discharge. An RF generator 40 has an RF electrode suitably positioned to couple power into the reaction chamber, with a reflector 42 positioned opposite the electrode for reflecting energy back into the active zone. Reflector 42 is positioned adjacent the heating lamp filament 43 for heating the graphite holder 34 and substrate positioned thereon. A graphite holder 34 is provided in the active zone coupled to electrical ground for supporting the substrate on which the deposition is to be formed. To insure uniformity in thickness of the deposit, the semiconductor substrates need to be electrically grounded to prevent build-up of surface charge, which function the grounded graphite holder 34 provides.

Thermocouple pressure gauge 44 monitors the pressure of the reactor for determining pressures suitable for sustaining the RF reaction. Cap 32 encloses the loading end which, upon removal, allows positioning of the semiconductor substrates within the active zone of the reactor. The gas mixing chamber 30 is coupled by a valve to the active region of the chamber. The constituent gases which upon ionization provide the reactive plasma deposit are respectively coupled through flow meters 28 from bottles 20, 22, 24 and 26 to the gas mixing chamber 30 through valves providing a controlled leak rate. Flow meters 28 monitor the leak rate of the gases into the mixing chamber. Particular attention is drawn to the interrelationship of bottles 20 and 22. Typically a controlled amount of an inert carrier gas under high pressure is bubbled through the reservoir 22 which contains a controlled pressure and temperature volume of an organometallic solution. That is, the organometallic compound in bottle 22 comprises the desired impurity such as zinc which is to be injected into the subsequently formed doped oxide layer. The controlled leak valve coupling jars 20 and 22 to the gas mixing chamber 30 couples the carrier gas containing the vaporized organometallic solution into the chamber.

A complete understanding of the method of this invention is best understood by describing operation of the reactor shown in FIG. 2 in providing the sequence of FIG. 1. After loading the semiconductor substrate onto the graphite holder 34 and replacing the cap 32 over the loading end, the cryopumps 48 and the oil-free roughing pump coupled through valve 50 evacuate the reaction chamber to an approximate pressure of $10^{-3}$ mm mercury. Utilizing dimethyl zinc as a suitable organometallic compound in the reservoir 22, a temperature of 15°–25°C in the case of dimethyl zinc, and a pressure of 4–6 psig is preferably utilized. Suitable dopant compounds, depending upon the particular doping element to be diffused into the substrate, may be hydrogen selenide for a selenium dopant, dimethyl cadmium for the cadmium dopant, hydrogen sulfide for a sulfur dopant, hydrogen telluride or diethyl telluride for a tellurium dopant, or dimethyl zinc or diethyl zinc for a zinc dopant. The organometallic compounds are pyrophoric and explode upon contact with the air.

To provide the undoped oxide layer 7 depicted in FIG. 1*b*, a controlled flow of an oxygen producing gas such as nitrous oxide is provided into the reaction chamber from bottle 26. A suitable flow is, for example, 30 cc/min. of nitrous oxide. A silicon producing gas, such as preferably silicon hydride, is also provided into the gas mixing chamber, with a typical flow rate of 7 cc/min. The reactants are metered into the reactor through flow meters and flow through the active zone contacting the surface of the substrate. Trichlorosilane, silicon tetrachloride and ethyl silicate are also suitable silicon providing compounds. The operating pressure of the system is controlled by either adjusting the total gas flow rate or the pump valves. When a pressure of 100–300 $\mu$m Hg is reached, the RF generator 40 provides continuous RF discharge at 13.5 $MH_z$, *a* frequency set by the Federal Communications Commission. A frequency of 5–50 $MH_z$ is suitable. The RF discharge from the electrode into the active region ionizes the flow of gases. The above reaction is believed to proceed according to Equation 1:

$$SiH_4 \text{ (silane)} + 2N_2O \text{ (nitrous oxide)} + \text{RF energy} \rightarrow SiO_2 + 2H_2 + 2N_2$$

EQN 1 the $SiO_2$ deposits on the substrate as a solid film and the gaseous by-products are removed from the reaction chamber by the cryogenic pumps 48. After having deposited a sufficient thickness of layer 7, a controlled flow of the argon-dimethyl zinc vapor of about 1 cc/min. is maintained through the chamber, and the reactor operating pressure is again adjusted to a pressure of 100–300 $\mu$m Hg. The RF generator then provides a continuous RF field to ionize the gases. The slices may rest at room temperature of 20°C, or they may be heated to a temperature of some 300°C by the heater element and reflector 42. The doped oxide layer 8 is believed formed according to Equation 2:

$$(C_2H_5)_2 Zn + H_2 \rightarrow Zn + 2C_2H_6$$

or $$(CH_3)_2 Zn + H_2 \rightarrow Zn + 2CH_4.$$

EQN 2

Some of the zinc may also combine with oxygen to form zinc oxide and further contibute to the doping. The amount of the zinc compound introduced into the reactor is determined by the argon flow rate, the argon gas pressure, and the vapor pressure of the organometallic compound in the reservoir which is a known function of the reservoir temperature. The amount of flow of the zinc compound is typically one-half of the silane flow for most VLED applications.

Utilizing the above-mentioned pressures, the concentration of the zinc dopant forming in the silicon dioxide being formed in accordance with Equation 1 is readily determined. The RF discharge continues to form layer 8 sufficiently thick to contain the desired amount of impurity.

As above-mentioned, a subsequent overlying oxide layer 10 often is necessitated to protect the Group III–V substrate during the high temperature drive-in step. Therefore, the argon-dimethyl zinc flow is terminated, and an undoped oxide layer is formed in accordance with Equation 1 to the desired thickness. After deposition the slices are removed from the reactor and placed in an open-ended diffusion furnace. The temperature in the furnace is sustained at 800°–850°C for five to ten minutes to provide the drive-in cycle. The zinc migrates from the oxide layer 8 into the semiconductor layer 4 to a thickness determined by the time duration of drive-in. As noted above, only 1% of the zinc dopant diffuses from the oxide layer 8 into the gallium arsenide phosphide layer 4. After sufficient dopant has been diffused into the layer 4, the cycle is completed resulting in a structure as shown in FIG. 1*e* or FIG. 1*g*. Overlying oxide layers 6, 7, 8 and 10 (FIG. 1*e*) or 6, 8 and 10 (FIG. 1*g*) are thereafter removed utilizing conventional etchants to provide the device of FIG. 1f or FIG. 1h.

The above-described operation has been described in conjunction with a Group III–V substrate. However, the method is also advantageously applied to a silicon or germanium substrate. Utilizing such a substrate, then the dopant compound supplied into the reactor is arsine gas or trimethyl arsine for an arsenic dopant, phosphine gas or trimethyl phosphine for a phosphorus dopant, diborane or boron trimethyl gas for a boron dopant, triethyl indium for an indium dopant, trimethyl antimony for an antimony dopant, and trimethyl aluminum for an aluminum dopant. Heretofore, the latter three organometallic compounds have been unsuitable for RF deposition due to their liquid state and pyrophoric nature. The method of this invention, however, allows utilization of even such liquid organometallic compounds. Following deposition of a doped dielectric layer using a toxic dopant compound, e.g., arsine, the reactor is purged with nitrogen introduced through the flow control valve 46.

The term organometallic compound is readily understood by those skilled in the art, but particular advantages are achieved when utilizing liquid Group II, III, V and VI organometallic compounds. As these liquids are pyrophoric, heretofore they have been unsuitable for conventional diffusion techniques.

The method and equipment of this invention allows deposit of a dielectric film in a low pressure, low temperature electrical discharge system. The film contains an impurity suitable for selectively converting Group III-V compounds and Group IV compounds into either n-or p-type. The diffusion into the III–V substrate may be carried out in an open tube furnace without degrading the surface of the semiconductor. The method provides counteraction of the out-diffusing characteristics of the Group V elements by allowing either additional doping of the dielectric film or by depositing a similar undoped dielectric overlying the doped dielectric in the same reactor. The method further depicts a suitable technique for transporting the high vapor pressure organometallic compound into the reactor in a vapor form suitable for a reactive plasma deposition layer formation. Utilization of the present invention eliminates the sealed ampoule requirement for diffusion in Group III–V semiconductors. The exact amount of diffusion is more accurately provided by this invention over techniques heretofore utilized.

While an illustrative embodiment of the invention has been described herein, various modifications to the details will be apparent to those skilled in the art without departing from the scope of the invention.

What is claimed is:

1. A method of forming an impurity-doped dielectric layer on a substrate comprising the steps:

a. positioning the substrate in a reaction zone, said substrate having a masking layer with apertures therein on a surface of said substrate;

b. passing a gaseous silicon containing compound and a gaseous oxygen containing compound into contact with said substrate, and generating an RF discharge within said zone adjacent said substrate of sufficient energy to cause a reaction of said gases and the consequent reactive plasma deposition of a relatively thin, undoped silicon oxide layer on said masking layer, covering said substrate surface within the apertures in said masking layer;

c. without removing the substrate from said reaction zone, passing an inert gaseous carrier through a reservoir of dopant compound to provide a controlled amount of dopant vapor in said gaseous carrier;

d. passing a selected mixture of source gases adjacent to said substrate, said mixture comprising a flow of said carrier containing said dopant vapor, a controlled flow of a gaseous silicon providing compound, and a controlled flow of a gas which provides a source of oxygen; and e. generating a low temperature RF discharge within said zone adjacent said substrate of sufficient energy to cause a reaction of said gases and the consequent reactive plasma deposition of a relatively thick dielectric layer on said relatively thin silicon oxide layer.

2. The method of claim 1 wherein said substrate is a group III–V compound and said dopant compound is an organometallic compound.

3. The method of claim 2 wherein said organometallic compound is selected from the group consisting of diethyl zinc, dimethyl zinc and dimethyl cadmium.

4. The method of claim 1 and further including the step of heating said substrate to a temperature between 20°C and 300°C and wherein the pressure in the reaction zone is controlled between 100 and 300 $\mu$m Hg.

5. The method of claim 1 wherein said substrate is a group IV element selected from the group consisting of germanium and silicon and wherein said dopant compound comprises a dopant selected from the group consisting of arsenic, phosphorous, boron, indium, antimony and aluminum.

6. The method of claim 5 wherein said organometallic vapor is chosen from the group consisting of arsine gas, phosphine gas, diborane gas, triethyl indium, trimethyl antimony, and trimethyl aluminum.

7. A method of diffusing an impurity into a Group III–V semiconductor substrate comprising the steps of:

a. positioning said semiconductor substrate within a reaction zone;

b. passing an inert gaseous carrier through a reservoir of an organometallic compound to provide a controlled amount of organometallic vapor in said gaseous carrier;

c. passing a selected mixture of source gases through the reaction zone in contact with said substrate, said mixture comprising a flow of said carrier having said organometallic vapor therein, a controlled flow of a silicon hydride, and a controlled flow of a gaseous source of oxygen;

d. generating a low temperature RF discharge within said zone adjacent said substrate thereby causing reactive plasma deposition of a doped oxide layer on said substrate;

e. depositing a barrier layer on said doped layer; and f. heating the oxide-coated substrate to a temperature of 800°–850°C for a selected length of time.

8. The method according to claim 7 wherein said gaseous source of oxygen is nitrous oxide, said inert gaseous carrier is argon, and said silicon producing gas is silane.

9. The method of claim 8 wherein said semiconductor comprises a Group III–V compound selected from the group consisting of gallium arsenide, indium antimonide, gallium aluminum arsenide, gallium indium arsenide, gallium arsenide phosphide and gallium phosphide.

10. The method according to claim 9, wherein said organometallic compound contains a dopant selected from the group consisting of zinc, cadmium and telluride.

11. A method of forming a doped region in a semiconductor substrate, comprising:

a. positioning the semiconductor substrate in a low-pressure reaction zone, said substrate having a masking layer with apertures therein on a surface thereof;

b. passing an inert gaseous carrier through a reservoir of a dopant compound to provide a controlled amount of dopant vapor in said gaseous carrier;

c. passing a selected mixture of source gases through said reaction zone to contact said substrate through said apertures in the masking layer, said mixture comprising a flow of said carrier containing dopant vapor, a controlled flow of gaseous silicon providing compound, and a controlled flow of a gas which provides a source of oxygen; and d. generating a low temperature RF discharge within said reaction zone adjacent said substrate of sufficient energy to cause a reaction of said gases and consequent reactive plasma deposition of a doped oxide layer on the surface of the semiconductor substrate having said masking layer thereon.

12. The method of claim 11, where said dopant compound is an organometallic compound.

13. The method of claim 12, wherein said semiconductor substrate is a group III-V semiconductor compound, and further comprising the steps of:

a. depositing a barrier layer over said doped oxide layer without removal of said substrate from said reaction zone, by passing a controlled flow of gaseous silicon providing compound and a controlled flow of a gaseous source of oxygen through said reaction zone;

b. generating an RF discharge within said zone adjacent said substrate of sufficient energy to cause a reaction of said gases and consequent reactive plasma deposition of an undoped oxide barrier layer over said doped oxide layer; and c. heating the barrier-layer-coated substrate for a selected length of time to a temperature sufficient to cause diffusion of dopant from said doped oxide layer into regions of said semiconductor substrate underlying said apertures in the masking layer.

* * * * *